(12) United States Patent
Uchida et al.

(10) Patent No.: US 6,867,378 B2
(45) Date of Patent: Mar. 15, 2005

(54) SOLDER PASTE AND TERMINAL-TO-TERMINAL CONNECTION STRUCTURE

(75) Inventors: Hiroki Uchida, Kawasaki (JP); Masayuki Ochiai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 281 days.

(21) Appl. No.: 10/078,424

(22) Filed: Feb. 21, 2002

(65) Prior Publication Data

US 2003/0066681 A1 Apr. 10, 2003

(30) Foreign Application Priority Data

Oct. 10, 2001 (JP) ........................................ 2001-312682

(51) Int. Cl.⁷ ................................................ H05K 1/16
(52) U.S. Cl. ........................ 174/260; 361/767; 361/722; 361/777
(58) Field of Search ................. 174/260; 361/767–774; 228/246, 247, 248.1, 248.5

(56) References Cited

U.S. PATENT DOCUMENTS

| | | | |
|---|---|---|---|
| 5,928,404 A | * | 7/1999 | Paruchuri et al. ............. 75/255 |
| 6,195,248 B1 | | 2/2001 | Kunishi et al. |
| 6,201,193 B1 | * | 3/2001 | Hashimoto ................. 174/260 |
| 6,235,996 B1 | * | 5/2001 | Farooq et al. ............... 174/257 |
| 6,360,939 B1 | * | 3/2002 | Paruchuri et al. ......... 228/248.5 |
| 6,373,000 B2 | * | 4/2002 | Nakamura et al. ........... 174/264 |
| 6,437,989 B1 | * | 8/2002 | Lopatin et al. ............. 361/760 |
| 6,576,931 B2 | * | 6/2003 | Furukawa et al. ............ 257/98 |

FOREIGN PATENT DOCUMENTS

| | | |
|---|---|---|
| JP | 2001-15478 | 1/2000 |
| JP | 2000-265294 | 9/2000 |

* cited by examiner

*Primary Examiner*—Kamand Cuneo
*Assistant Examiner*—Jeremy Norris
(74) *Attorney, Agent, or Firm*—Armstrong, Kratz, Quintos, Hanson & Brooks, LLP

(57) ABSTRACT

A solder paste contains a solder alloy powder and a metal powder dispersed in a flux. The solder alloy contains Sn and Zn, whereas the metal powder contains at least one element selected from the group consisting of Pd, Ti, and Ni. Preferably, the metal powder is contained in an amount exceeding the solubility limit of the metal powder with respect to the solder alloy at the melting point of the solder alloy powder. The solder paste may be used to form a structure for electrically connecting two objects by interposing a solder layer between their terminals.

11 Claims, 5 Drawing Sheets

SOLDER PASTE AND TERMINAL-TO-TERMINAL CONNECTION STRUCTURE

BACKGROUND OF THE INVENTION

1. Field of the Invention

The present invention relates to a solder paste, and to a structure for electrically connecting two objects by interposing a solder layer between their terminals.

2. Description of the Related Art

Soldering is employed, for example, in mounting of electronic components to a circuit board. With today's electronic devices, surface mounting technology is used to achieve higher mounting density of parts on a circuit board. In this surface mounting of parts, so-called "solder paste" is used. The solder paste is typically a mixture of a solder alloy powder with rosin, an organic solvent, a viscosity regulator, and a surfactant.

Sn—Pb alloys have long been widely used as solder alloys. Because of the toxicity of lead (Pb), however, Pb-free solder alloys have increasing replaced the Pb-containing solder alloys. Some of the Pb-free solder alloys commonly used are Sn—Ag—Cu alloys and Sn—Zn alloys.

A typical example of the composition of a Sn—Ag—Cu alloy is Sn-3.0Ag-0.5Cu. Sn-3.0Ag-0.5Cu contains 96.5 examples of the composition of a Sn—Zn alloy are Sn-9Zn and Sn-8Zn-3Bi. Sn-9Zn contains 91 wt % tin and 9 wt % zinc, while Sn-8Zn-3Bi contains 89 wt % tin, 8 wt % zinc, and 3 wt % bismuth.

However, a Sn—Ag—Cu solder alloy has a higher melting point than a Sn—Pb solder alloy. For instance, the melting point of a Sn-3.0Ag-0.5Cu solder alloy is 218° C., which is 35° C. higher than the melting point of a typical conventional Sn—Pb solder alloy. Consequently, there is inevitably the danger that low heat-resistant parts may be damaged during soldering. Something must be done to avoid this situation, such as arranging poor a heat-resistant part near a large thermal-capacity part in the design of a printed circuit board. Furthermore, when a Sn—Ag—Cu solder alloy is used, the soldering temperature has to be higher than with a conventional solder, so the equipment used for soldering also has to be changed.

In contrast, a Sn—Zn solder alloy has a lower melting point. For example, a Sn-8Zn-3Bi solder alloy has a melting point of 193° C., whereas a Sn-9Zn solder alloy has a melting point of 199° C. In either case, the soldering temperature for the Sn—Zn solder alloy is only about 10° C. higher than the conventional soldering temperature. Consequently, there is no problem in terms of the heat resistance of parts, and soldering can be performed using existing equipment.

Nevertheless, when a Sn—Zn solder alloy is used, the connection strength may decrease over time until a break occurs at the connection, causing the soldered part to come loose from the circuit board.

This problem occurs when an electronic component is mounted using an Sn—Zn solder alloy over a copper wiring pattern formed on a circuit board, for instance. Because Zn and Cu have a high affinity with each other, a ZnCu compound layer is readily formed in the copper wiring pattern at the interface with the solder alloy layer. The ZnCu compound layer thus formed grows over time due to solid phase diffusion of Zn from the solder alloy layer. The temperature of an electronic device often reaches about 80° C. during the operation of the device, and the thermal stress that accompanies this rise in temperature accelerates the solid phase diffusion of Zn. The strength of the soldered portions therefore decreases over time as the ZnCu compound layer grows.

SUMMARY OF THE INVENTION

In view of this, it is an object of the present invention to minimize the deterioration over time of connected portions soldered with a Pb-free Sn—Zn solder.

Another object of the present invention is to provide a terminal-to-terminal connection which utilizes such a solder.

According to a first aspect of the present invention, a solder paste provided which comprises a solder alloy powder and a metal powder dispersed in a flux. The solder alloy powder includes Sn and Zn as constituent elements. The metal powder contains at least one element selected from the group consisting of Pd, Ti, and Ni.

Preferably, the metal powder is contained in an amount exceeding the solubility limit of the metal powder with respect to the solder alloy at the melting point of the solder alloy powder.

Preferably, the metal powder contains a first metal element selected from the group consisting of Pd, Ti, and Ni, and a second metal element other than Pd, Ti, and Ni. The role of the second metal element is to aid the dispersion of the particles of the first metal element in the matrix in which the solder alloy powder is melted. Accordingly, Sn or Zn, which are components contained in the solder alloy powder, is preferably used as the second metal element. Because Sn usually accounts for a greater weight ratio than Zn in a Sn—Zn solder, it is preferable in this case to use Sn as the second metal element.

Preferably, the metal powder is a composite metal powder including the first and second metal elements. This composite metal powder may comprises particles of the first metal element, each particle of the first metal element being covered with a material containing the second metal element. Electroless plating, for example, may be employed as the means for coating the particles of the first metal element.

Preferably, the metal powder has a weight average particle size of no more than 40 $\mu$m. It is even better if the weight average particle size of the metal powder is 5 to 40 $\mu$m, particularly 5 to 20 $\mu$m. If the weight average particle size of the metal powder is too large, the metal powder may have poor dispersibility when the solder alloy powder is melted. On the other hand, if the weight average particle size is too small, the manufacturing cost will be higher, but no corresponding increase in the effect can be anticipated. When the dispersibility of the metal powder is taken into account, it is preferable if the particles of the metal powder have a substantially spherical shape.

According to a second aspect of the present invention, a terminal-to-terminal connection structure is provided for electrically connecting two objects by interposing a solder layer between their terminals. At least one of the first object and the second object has a surface layer containing Cu. The solder layer includes a matrix containing Sn and Zn as constituent elements, and non-solid-solution particles containing at least one element selected from the group consisting of Pd, Ti, and Ni.

Examples of the first object include circuit boards and electronic components, and those of the second object include electronic components. The term "circuit board" as used herein refers to an insulating substrate on which a wiring pattern is formed, and on which a plurality of electronic components are to be mounted. There are no particular restrictions on the material of the insulating substrate, which may be an organic material (such as a glass-fiber-reinforced epoxy resin or polyimide resin) or an inorganic material (such as a ceramic). The term "electronic component" as used herein encompasses an electronic element (bare chip) itself, as well as an electronic element sealed in a resin, a combination of an electronic element and an insulating substrate which supports the electronic element and has terminals for surface mounting [such as a BGA (ball grid array)], and so forth. "Electronic element" encompasses a conductor, a resistor, a semiconductor device, and so forth (such as a chip resistor, chip capacitor, a diode chip, etc.).

A specific example of an electronic component is a surface-mount electronic component which includes an electronic element, a resin package for sealing the electronic element, and lead having an outer terminal extends out from the resin package. With such a surface-mounting electronic component, the outer terminal may be designed, for example, to have a horizontal mounting surface that extends substantially in flush with the bottom surface of the resin package. In this case, the mounting surface of the outer terminal and a corresponding terminal of the circuit board are electrically connected via the solder layer.

It is preferable if the non-solid-solution particles have a weight average particle size of no more than 40 μm. It is even better if the non-solid-solution particles have a weight average particle size of 5 to 40 μm, particularly 5 to 20 μm. Preferably, the non-solid-solution particles are substantially spherical.

According to the present invention, the solder paste comprises not only a solder alloy powder dispersed in a flux, but also a metal powder containing at least one element selected from among Pd, Ti, and Ni as also dispersed in the flux. Accordingly, with a connection structure provided by the solder paste, non-solid-solution particles (metal powder) are dispersed in a matrix of the solder alloy. The non-solid-solution particles allow the solid-phase Zn dispersed in the matrix to be fixed, so the formation of a ZnCu compound can be suppressed. As a result, there is less strength reduction at the soldered connections, thereby enhancing connection stability and reliability.

JP-A-2000-15478, JP-A-11-189894, and JP-A-2000-265294 for example discloses addition of Ti, Ni or the like to a Sn—Zn alloy. However, JP-A-2000-15478 teaches that the added Ti, Ni or the like melts simultaneously with the melting of the solder material. According to the present invention, on the other hand, the added metal powder does not melt during the melting of the solder alloy, consequently providing a connection structure in which the non-solid-solution particles of the added metal powder are dispersed in the matrix of the solder alloy. Therefore, the solder material disclosed in JP-A-2000-15478 is completely different in its technical concept from the present invention. Further, JP-A-11-189894 and JP-A-2000-265294 merely discloses the idea of adding Ti, Ni or the like in order to improve wettability or affinity of the solder alloy with respect to the terminals to be connected, thus basically differing in concept from the present invention (wherein add Ti, Ni or the like is added for the purpose of fixing Zn). What can be said to be in common with these publications is that they equally fail to suggest the problems which the present invention aims to solve, and that metal particles are not dispersed in a particulate state during the melting and solidification of the solder alloy.

DESCRIPTION OF THE PREFERRED EMBODIMENTS

Figure 1:
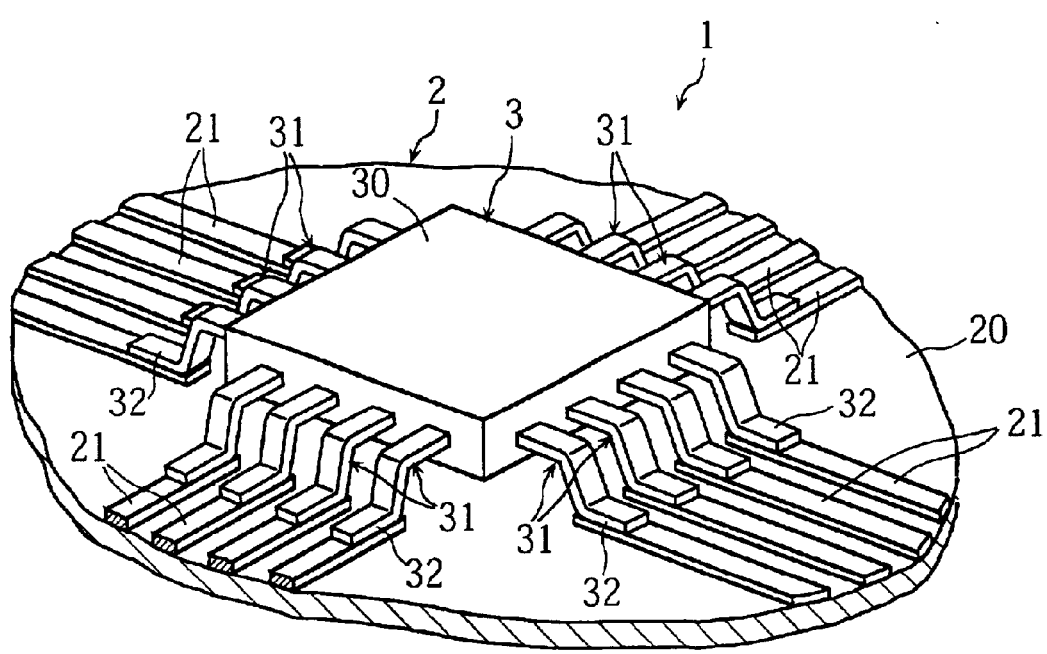
FIG. 1 is a perspective view illustrating a solder connection structure.
Figure 2:
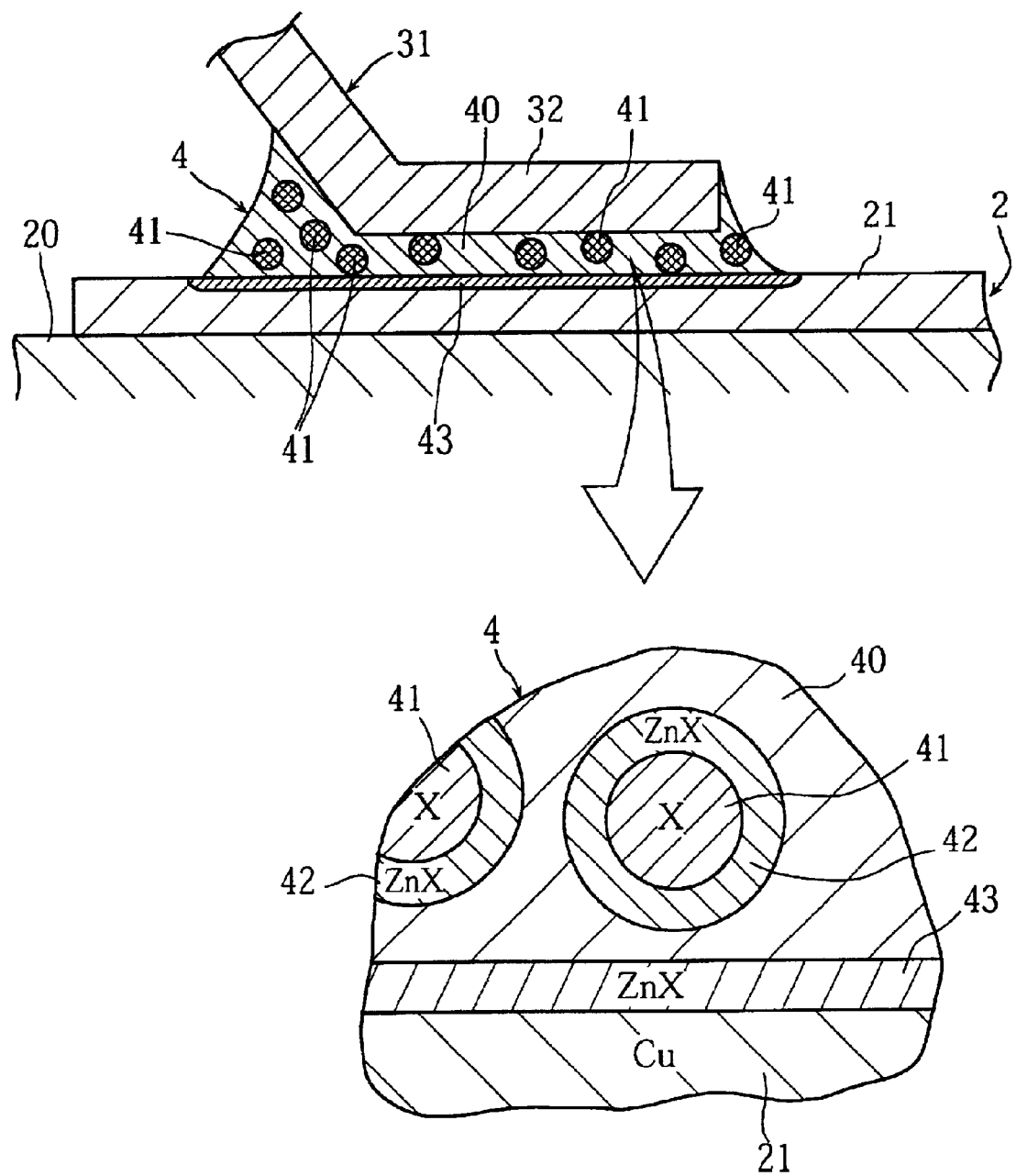
FIG. 2 is an enlarged sectional view showing the principal part (solder connection) of FIG. 1.

Preferred embodiments of the present invention will now be described with reference to the drawings. FIG. 1 is a perspective view of an electronic device, illustrating an example of the solder connection structure of the present invention. FIG. 2 is an enlarged view shown the details of the solder connection.

The electronic device 1 has a circuit board 2 and an electronic component 3. The circuit board 2 comprises a copper wiring pattern 21 formed over an insulating substrate 20. The insulating substrate 20 may made of a ceramic or a glass-fiber-reinforced epoxy resin, for example. The copper wiring pattern 21 may be formed by vapor deposition or sputtering followed by etching, for example.

The electronic component 3 comprises an electronic element such as a semiconductor chip (not shown) sealed within a resin package 30. A plurality of leads 31 extend out from the resin package 30. The leads 31 are bent in a crank shape so that their distal ends or terminals 32 lie substantially within the same plane as the bottom surface of the resin package 30. Each of the terminals 32 provides a mounting surface facing a corresponding portion (counterpart terminal) of the wiring pattern 21.

As shown in FIG. 2, the terminal 32 and the wiring pattern 21 are connected via a solder layer 4. The solder layer 4 comprises non-solid-solution particles 41 dispersed in a matrix 40 of a solder alloy. A solder connection structure such as this may be formed through the successive steps shown in FIGS. 3a to 3c.

Figure 3A:
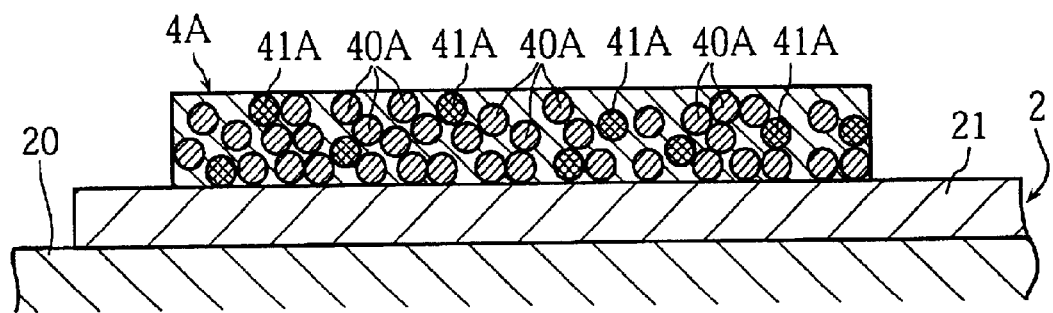
FIG. 3 are sectional views showing the successive steps for forming a solder connection.

First, as shown in FIG. 3a, deposits (only one shown) of solder paste 4A is formed over the copper wiring pattern 21 on the circuit board 2. The solder paste may be applied over the copper wiring pattern 21 by a screen printing method, for example. More specifically, with a metal mask having openings accurately positioned on the circuit board 2, the openings are filled with a solder paste, and the mask is then removed to leave the patterned solder paste.

The solder paste may be prepared by dispersing a solder alloy powder 40A and a metal powder 41A in a flux. The flux may be prepared by mixing 50 to 90 weight parts of a solvent, 5 to 20 weight parts of a viscosity regulator, and 0.5 to 10 weight parts of a surfactant in 100 weight parts of rosin. Examples of solvents include benzene, toluene, and α-terpineol. Examples of viscosity regulators include glycerol, polyethylene glycol, and hydrogenated castor oil. Examples of surfactants include an amine halogenated hydroacid salt and diphenyl guanidine HBr.

The solder alloy powder 40A contains Sn and Zn as its constituent elements. Typically, a powder of a Sn—Zn alloy may used, for example. Examples of Sn—Zn alloys that can be used favorably include an Sn-9Zn alloy (91 wt % Sn, 9 wt % Zn) and an Sn-8Zn-3Bi alloy (89 wt % Sn, 8 wt % Zn, and 3 wt % Bi). It is preferable if the solder alloy powder 40A has a weight average particle size of 20 to 40 μm.

The metal powder 41A used here contains at least one element X selected from the group consisting of Pd, Ti, and Ni. Preferably, the metal powder 41A is contained in an amount exceeding its solubility limit with respect to the solder metal at the melting point of the solder alloy powder 40A. The metal powder 41A may be an alloy of different metal elements, or it may be prepared by coating core particles of a metal element by electroless plating or any other method. More specifically, the metal powder 41A may be an alloy of the metal element X and a different metal element, or particles of the metal element X may be coated with a different metal element. Sn and Zn may be favorably used as the element that is different from the element X. When the metal powder 41A comprises the element X and a different element (particularly one of the metal elements which make up the solder alloy), the metal elements can be properly dispersed in the matrix of the solder alloy when the solder alloy powder 40A is melted. Because Sn usually accounts for a greater weight ratio than Zn in a Sn—Zn solder, it is preferable in this case to use Sn as the element that is different from the element X.

The weight average particle size of the metal powder 41A is 40 μm or less, for example, with 5 to 40 μm being preferable, and 5 to 20 μm being best. If the weight average particle size of the metal powder 41A is too large, the dispersibility of the metal powder 41A will be poor when the solder alloy powder 40A is melted. On the other hand, if the weight average particle size is too small, the manufacturing cost will be higher, but no corresponding increase in the effect can be expected. When the dispersibility of the metal powder 41A is taken into account, the particles of the metal powder 41A should be substantially spherical.

Figure 3B:
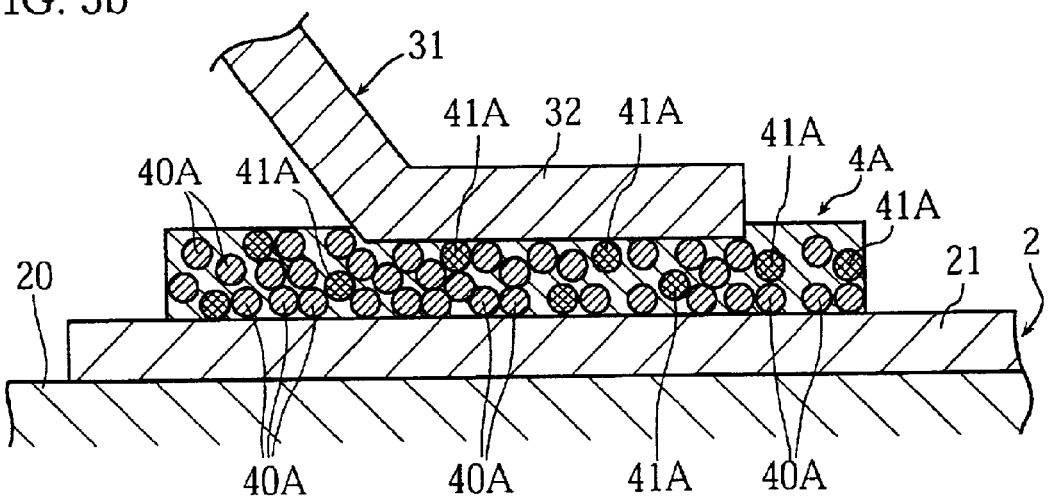

Next, the electronic component 3 is placed on the circuit board 2. At this point, as shown in FIG. 3b, the mounting end 32 of each lead 31 is aligned with a corresponding deposit of the solder paste 4A.

Figure 3C:
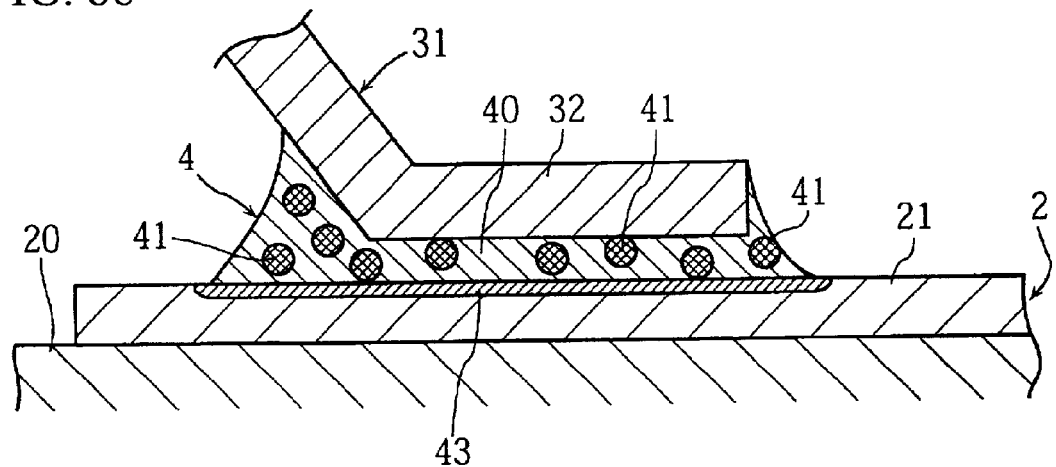

The solder paste 4A is then heated to 215° C., for example. As a result, the solder paste 4A (the solder alloy powder 40A) melts under the antioxidative action of the flux. When the melted solder alloy is then solidified, the mounting end 32 of each lead 31 is connected to the copper wiring pattern 21 via the solder layer 4, as shown in FIG. 3c. In the formation of the solder layer 4, the copper in the copper wiring pattern 21 reacts with Zn in the solder alloy, forming a thin ZnCu compound layer 43 on the surface of the copper wiring pattern 21.

A mixture of the metal powder 41A with the solder alloy powder 40A is used as the solder paste (see FIG. 3a). Preferably, such a mixture should contain the metal powder 41A in an amount exceeding the solubility limit with respect to the solder alloy at the melting point of the solder alloy. Therefore, even if the solder alloy powder 40A is melted, the metal powder 41A will remain as powder (as non-solid-solution particles 41) dispersed in the matrix 40 of the Sn—Zn alloy, as shown in FIG. 2.

Figure 4:
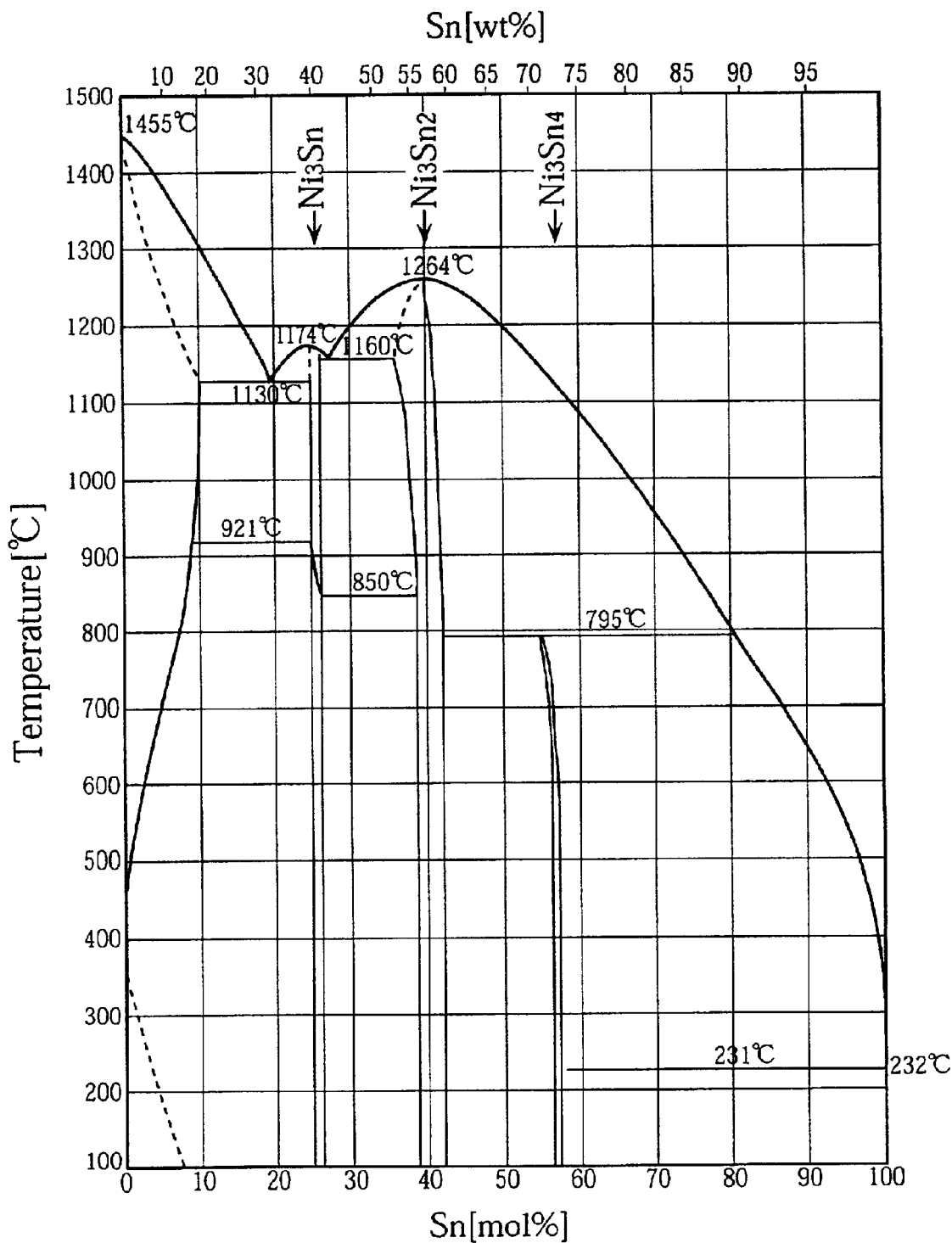
FIG. 4 is a graph showing the phase equilibrium of Sn—Ni.

FIG. 4 is a phase equilibrium graph of Sn—Ni. In this graph, the melting point of the Sn—Ni alloy is over 232° C., which is the melting point of Sn, and the melting point rises as the amount of Ni in the alloy increases. Thus, even if the solder alloy powder 40A melts, the metal powder 41A will remain as the non-solid-solution particles 41 in the matrix 40 without entirely melting.

With the non-solid-solution particles 41 being present in the matrix 40, even if Zn diffuses in the solid matrix 40, Zn is captured by the non-solid-solution particles 41 before it reaches the copper wiring pattern 21. In other words, a compound layer of the element X and Zn is formed on the surface of the non-solid-solution particles 41, as shown schematically in FIG. 2. The inventors have confirmed this effect by electron microscope observations of cross sections of a solder layer which contained substantially spherical pure Ni particles as the metal powder.

Therefore, Zn can be inhibited from reaching the copper wiring pattern 21 by having the non-solid-solution particles 41 containing the element X present in the matrix 40. As a result, it is possible to suppress the diffusion of Zn into the copper wiring pattern 21 and the formation of a ZnCu compound layer, or the growth of a ZnCu compound layer in the copper wiring pattern 21. This means that deterioration of the solder connections over time can be minimized, and as a result, the joint strength of the solder connections will be stable for a longer period, which improves reliability and service life. Also, Zn has the sole function of lowering the melting point of the solder alloy particles during soldering, and there is no problem whatsoever if Zn is captured by the non-solid-solution particles 41 after the soldering is complete.

EXAMPLES

Examples 1 to 6 of the present invention will now be described along with a Comparative Example 1. In these examples and comparative examples, we examined the change over time (aging) in the thickness of the ZnCu compound layer when the electronic device shown in FIG. 1 was kept at 150° C. These results are given in FIG. 5. The thickness of the ZnCu compound layer was determined by observation of the solder connections with an electron microscope.

The electronic device 1 was manufactured basically as described through reference to FIGS. 3a to 3c. The solder paste was applied over the copper wiring pattern 21 by screen printing using a metal mask.

The solder paste was prepared by mixing a Sn—Zn solder alloy powder in a flux as shown in Table 1 below. A metal powder was further added in Examples 1 to 6. The metal powder comprised Sn-plated Pd, Ti, or Ni in Examples 1 to 3, and in Examples 4 to 6 it was in the form of an alloy of Pd, Ti, or Ni with Sn, adjusted such that the weight ratio was 50:50. The metal powder contained substantially spherical particles with a weight average particle size of 20 μm.

The Sn—Zn alloy in Examples 1, 3, and 5 had a composition of Sn-8Zn-3Bi (89 wt % tin, 8 wt % zinc, and 3 wt % bismuth; 193° C. melting point), and its powder contained substantially spherical particles with a weight average particle size of 30 μm. In Examples 2, 4, and 6 and Comparative Example 1, the Sn—Zn alloy had a composition of Sn-9Zn (91 wt % tin and 9 wt % zinc; 199° C. melting point), and its powder contained substantially spherical particles with a weight average particle size of 30 μm.

TABLE 1

| Composition of solder paste | | |
|---|---|---|
| Example 1 | Sn-8Zn-3Bi powder | 80 weight parts |
| | pure Ni powder (Sn plated) | 8 weight parts |
| | flux | 12 weight parts |
| Example 2 | Sn-9Zn powder | 80 weight parts |
| | pure Pd powder (Sn plated) | 8 weight parts |
| | flux | 12 weight parts |
| Example 3 | Sn-8Zn-3Bi powder | 80 weight parts |
| | pure Ti powder (Sn plated) | 8 weight parts |
| | flux | 12 weight parts |

TABLE 1-continued

| Composition of solder paste | | |
|---|---|---|
| Example 4 | Sn-9Zn powder | 80 weight parts |
| | Sn-50Ni powder | 8 weight parts |
| | flux | 12 weight parts |
| Example 5 | Sn-8Zn-3Bi | 80 weight parts |
| | Sn-50Pd powder | 8 weight parts |
| | flux | 12 weight parts |
| Example 6 | Sn-9Zn powder | 80 weight parts |
| | Sn-50Ti powder | 8 weight parts |
| | flux | 12 weight parts |
| Comparative Example 1 | Sn-9Zn powder | 90 weight parts |
| | flux | 10 weight parts |

The composition of the flux is given in Table 2 below. A solder paste containing a flux with the composition shown in Table 2 is available from Showa Denko K. K. (Japan) as Juffit-E 8Z3B05M2 which may be prepared by adding Sn-8Zn-3Bi in the proportion shown in Table 1 to a flux with the composition shown in Table 2. In other words, the solder pastes in Examples 1, 3, and 5 were prepared by adding a metal powder to Juffit-E 8Z3B05M2. Meanwhile, the solder pastes in Examples 2, 4, and 6 and Comparative Example 1 had a basic composition in which the Sn-8Zn-3Bi of Juffit-E 8Z3B05M2 was replaced with Sn-9Zn.

TABLE 2

| Flux composition | |
|---|---|
| rosin | 60 weight parts |
| solvent | 36 weight parts |
| viscosity regulator | 3 weight parts |
| surfactant | 1 weight part |

Figure 5:
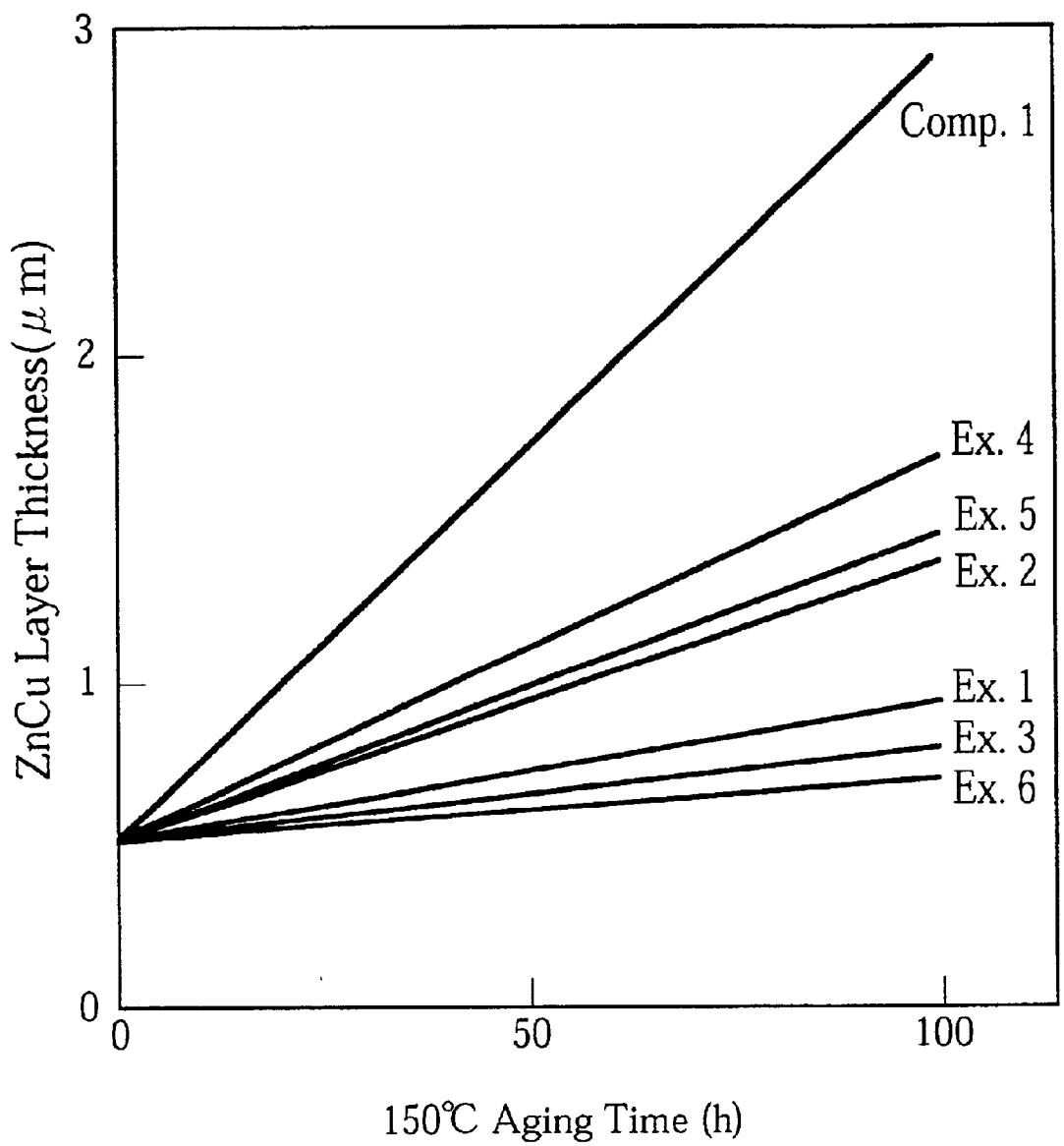
FIG. 5 is a graph of the change over time in the thickness of a ZnCu compound layer.

As is clear from FIG. 5, with Examples 1, 3, and 5, the thickness of the ZnCu compound layer did not reach 1 μm even when the solder joints were left for 100 hours at 150° C. With Examples 2, 4, and 6, the thickness of the ZnCu compound layer did not reach 1.5 μm when the solder joints were left for 100 hours at 150° C. In contrast, with Comparative Example 1, in which no metal powder 23 was introduced into the solder paste, the thickness of the ZnCu compound layer reached nearly 3 μm when the solder joints were left for 100 hours at 150° C. Thus, in the examples of the present invention, introducing a metal powder containing Pd, Ti, or Ni into the above-mentioned solder paste suppressed the growth of the ZnCu compound layer. Deterioration of the strength of solder connections made with a Sn—Zn (Pb-free) solder can therefore be effectively avoided.

Naturally, the present invention is not limited to the embodiments and examples given above, and various changes and modifications are possible within the scope of the claims.

With the present invention, using a solder paste comprising a solder alloy powder dispersed in a flux, a metal powder containing at least one element selected from the group consisting of Pd, Ti, and Ni is dispersed in addition to the solder alloy powder into the flux. Accordingly, with a connection structure provided by this solder paste, non-solid-solution particles (metal powder) are dispersed in a matrix. These non-solid-solution particles are able to fix Zn diffused in solid phase in the matrix, so the formation of a ZnCu compound can be suppressed. As a result, there is less reduction in the strength of the solder connections, thus enhancing connection stability and reliability.

What is claimed is:

1. A solder paste comprising a solder alloy powder and a metal powder dispersed in a flux,
   wherein the solder alloy powder includes Sn and Zn as constituent elements, and
   wherein the metal powder contains at least one element selected from the group consisting of Pd and Ti, and
   wherein the metal powder is contained in an amount exceeding the solubility limit of the metal powder with respect to the solder alloy at the melting point of the solder alloy powder.

2. The solder paste according to claim 1, wherein the metal powder has a weight average particle size of no more than 40 μm.

3. The solder paste according to claim 1, wherein the metal powder comprises substantially spherical particles.

4. A solder paste comprising a solder alloy powder and a metal powder dispersed in a flux,
   wherein the solder alloy powder includes Sn and Zn as constituent elements, and
   wherein the metal powder is a composite metal powder which includes a first metal element selected from the group consisting of Pd and Ti and a second metal element other than Pd and Ti, and
   wherein the composite metal powder comprises particles of the first metal element, each particle of the first metal element being covered with a material containing the second metal element.

5. A terminal-to-terminal connection structure for electrically connecting two objects by interposing a solder layer between the terminals,
   wherein at least one of the first object and the second object has a surface layer containing Cu, and
   wherein the solder layer includes a matrix containing Sn and Zn as constituent elements, and non-solid-solution particles containing at least one element selected from the group consisting of Pd and Ti;
   wherein the first object is a circuit board, and the second object is an electronic component;
   wherein the electronic component comprises an electronic element, a resin package for sealing the electronic element, and a lead having an outer terminal extending out from the resin package,
   the outer terminal having a horizontal mounting surface that extends substantially in flush with a bottom surface of the resin package,
   the mounting surface of the outer terminal and a corresponding terminal of the circuit board being electrically connected via the solder layer.

6. The terminal-to-terminal connection structure according to claim 5, wherein the non-solid-solution particles have a weight average particle size of no more than 40 μm.

7. The inter-terminal connection structure according to claim 5, wherein the non-solid-solution particles are substantially spherical.

8. A solder paste comprising a solder alloy powder and a metal powder dispersed in a flux,
   wherein the solder alloy powder includes Sn and Zn as constituent elements, and
   wherein the metal powder contains at least one element selected from the group consisting of Pd, Ti, and Ni, and
   wherein the metal powder is contained in an amount exceeding the solubility limit of the metal powder with respect to the solder alloy at the melting point of the solder alloy powder.

9. A solder paste comprising a solder alloy powder and a metal powder dispersed in a flux, wherein the solder alloy powder includes Sn and Zn as constituent elements, wherein the metal powder contains at least one element selected from the group consisting of Pd, Ti, and Ni, wherein the metal powder includes a first metal element selected from the group consisting of Pd, Ti, and Ni, and a second metal element other than Pd, Ti, and Ni, wherein the metal powder is a composite metal powder, and wherein the composite metal powder comprises particles of the first metal element, each particle of the first metal element being covered with a material containing the second metal element.

10. A terminal-to-terminal connection structure for electrically connecting two objects by interposing a solder layer between the terminals, wherein at least one of the first object and the second object has a surface layer containing Cu, wherein the solder layer includes a matrix containing Sn and Zn as constituent elements, and non-solid-solution metal particles containing at least one element selected from the group consisting of Pd, Ti, and Ni, and wherein the metal particles are contained in an amount exceeding the solubility limit of the metal particles with respect to the matrix of the solder layer at the melting point of the matrix of the solder layer.

11. A terminal-to-terminal connection structure for electrically connecting two objects by interposing a solder layer between the terminals, wherein at least one of the first object and the second object has a surface layer containing Cu, wherein the solder layer includes a matrix containing Sn and Zn as constituent elements, and non-solid-solution metal particles containing at least one element selected from the group consisting of Pd, Ti, and Ni, wherein the metal particles include a first metal element selected from the group consisting of Pd, Ti, and Ni, and a second metal element other than Pd, Ti, and Ni, wherein the metal particles comprise composite metal particles, and wherein the composite metal particles comprise particles of the first metal clement, each particle of the first metal element being covered with a material containing the second metal element.

* * * * *